(12) United States Patent
Blanchard et al.

(10) Patent No.: US 9,082,648 B2
(45) Date of Patent: Jul. 14, 2015

(54) VERTICAL INSULATED-GATE TURN-OFF DEVICE HAVING A PLANAR GATE

(71) Applicant: Pakal Technologies, LLC, San Francisco, CA (US)

(72) Inventors: Richard A. Blanchard, Los Altos, CA (US); Hidenori Akiyama, Miyagi (JP); Woytek Tworzydio, Austin, TX (US); Vladimir Rodov, Seattle, WA (US)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 14/192,057

(22) Filed: Feb. 27, 2014

(65) Prior Publication Data

US 2014/0240027 A1 Aug. 28, 2014

Related U.S. Application Data

(60) Provisional application No. 61/770,066, filed on Feb. 27, 2013.

(51) Int. Cl.
*H01L 29/10* (2006.01)
*H01L 29/739* (2006.01)
*H03K 17/30* (2006.01)
*H01L 29/745* (2006.01)

(52) U.S. Cl.
CPC ........ *H01L 29/1095* (2013.01); *H01L 29/7395* (2013.01); *H01L 29/7455* (2013.01)

(58) Field of Classification Search
None
See application file for complete search history.

(56) References Cited

U.S. PATENT DOCUMENTS 5,381,026 A * 1/1995 Shinohe et al. ............... 257/147
7,705,368 B2 4/2010 Rodov et al.

* cited by examiner

*Primary Examiner* — Erik Kielin
(74) *Attorney, Agent, or Firm* — Patent Law Group LLP; Brian D. Ogonowsky

(57) ABSTRACT

An insulated gate turn-off (IGTO) device has a layered structure including a p+ layer (e.g., a substrate), an n-type layer, a p-type layer (which may be a p-well), n+ regions formed in the surface of the p-type layer, and insulated planar gates over the p-type layer between the n+ regions. The layered structure forms vertical NPN and PNP transistors. The p-type layer forms the base of the NPN transistor. When the gates are sufficiently positively biased, the underlying p-type layer inverts to reduce the width of the base to increase the beta of the NPN transistor. This causes the product of the betas of the NPN and PNP transistors to exceed one, and the device becomes fully conductive. When the gate voltage is removed, the base width increases such that the product of the betas is less than one, and the device shuts off. No latch-up occurs in normal operation.

20 Claims, 5 Drawing Sheets

US 9,082,648 B2

VERTICAL INSULATED-GATE TURN-OFF DEVICE HAVING A PLANAR GATE

CROSS-REFERENCE TO RELATED APPLICATIONS

This application claims priority to provisional application Ser. No. 61/770,066, filed Feb. 27, 2013, by Richard Blanchard et al., assigned to the present assignee and incorporated herein by reference.

FIELD OF THE INVENTION

This invention relates to insulated gate turn-off (IGTOs) devices and, more particularly, to an IGTO device that uses a planar gate rather than a trenched gate.

BACKGROUND

FIG. 1 is a cross-sectional view of a portion of a prior art insulated gate turn-off (IGTO) device 10 described in U.S. Pat. No. 7,705,368, incorporated herein by reference. An NPNP semiconductor layered structure is formed. In FIG. 1, there is a PNP transistor formed by a p+ substrate 12, an n-type layer 14, and a p-well 16. There is also an NPN transistor formed by the layer 14, the p-well 16, and an n+ layer 18. A bottom anode electrode 20 contacts the substrate 12, and a top cathode electrode 22 contacts the n+ layer 18. Trenches 24, coated with an oxide layer 25, contain a conductive gate material 26 (forming interconnected vertical gate regions) which is contacted by a gate electrode 28. The p-well 16 surrounds the gate structure, and the n-type layer 14 extends to the surface around the p-well 16. Outside of the cross-section, the cathode electrode 22 may contact the p-well 16.

When the anode electrode 20 is forward biased with respect to the cathode electrode 22, but without a sufficiently positive gate bias, there is no current flow, since the product of the betas (gains) of the PNP and NPN transistors is less than one.

When there is a sufficient positive voltage (e.g., 2 volts) applied to the gate, and there is a sufficient forward-biasing anode-cathode voltage, electrons from the n+ layer 18 become the majority carriers along the sidewalls and below the bottom of the trenches 24 in an inversion layer, causing the effective width of the NPN base (the portion of the p-well 16 below the trenches 24) to be reduced. As a result, the beta of the NPN transistor increases to cause the product of the betas to exceed one. This results in "breakover," when holes are injected into the lightly doped n-type layer 14 and electrons are injected into the p-well 16 to fully turn on the device. This is a controlled latch-up of the device. Accordingly, the gate bias initiates the turn-on, and the full turn-on is accomplished by the current flow through the NPN and PNP transistors.

According to the '368 patent, when the gate bias is made negative (e.g., −2 volts), the IGTO device turns off.

Such IGTO devices have a relatively high current density when on. In contrast, insulated gate bipolar transistors (IGBTs) generally have a lower current density when on. Accordingly, for at least high current applications, IGTO devices are preferred. Further, IGTO devices are typically used as on-off switches, while IGBTs may be used to smoothly modulate current.

The processing steps for forming trenched gates are time-consuming and therefore expensive. Further, the depth of the trench affects the turn-on voltage, and there is typically an undesired variation in gate trench depth from lot to lot. It follows that the gate voltage needed to decrease the NPN transistor base width to cause the product of the gains to exceed one (to initiate turn-on) is difficult to reproduce from one lot of IGTO devices to another.

Therefore, what is needed is a new design for an IGTO device that does not require a trenched gate and does not have the above-mentioned drawbacks.

SUMMARY

A vertical IGTO device is described that uses planar gates at the surface rather than trenched gates. Although vertical NPN and PNP bipolar transistors are required for this device to operate, the term "thyristor" is not used to describe the device, since the term "thyristor" is conventionally used to describe a structure that latches in its on state and can only be turned off by lowering the current below a threshold level, such as by reversing the current in an AC application. In contrast, the present device can be turned on and off by gate control, making the device far more useful than a traditional thyristor. The turn-off may be by shorting the gate to the cathode electrode.

In one embodiment, an anode electrode (a metal layer) is formed on the bottom surface of a p+ substrate. A lightly doped n-type layer is formed over the p+ substrate, followed by a lightly doped p-type layer. Shallow n+ regions are formed in the surface of the p-type layer. The p-type layer is shorted to the n+ regions by distributed p+ regions formed through selected n+ regions, where a metal cathode electrode contacts the tops of the p+ regions and n+ regions. The resistance between a surface p+ region and the p-type layer increases with distance, allowing a voltage differential of at least 0.6 volts to exist between the n+ regions and the p-type layer at sufficiently high currents.

A thin dielectric layer (thermally grown high quality gate oxide) is formed over the p-layer surface between adjacent n+ regions, and planar gates are formed over the dielectric layer between the n+ regions. Another dielectric layer is formed over the tops of the gates and exposes the n+ regions and surface p+ type regions.

A cathode electrode (a metal layer) is formed overlying the insulated gates and directly contacts the top surface of the n+ regions and p+ regions.

The p-type layer acts as a base for the NPN bipolar transistor formed by the n+ regions (emitters), p-type layer (base), and n-type layer (collector). When the gates are shorted to the cathode electrode, the effective base width is long, resulting in a low beta for the NPN transistor. The p-type layer, the n-type layer, and the p+ substrate form a PNP bipolar transistor. With a forward bias voltage applied to the anode and cathode electrodes, the product of the betas of the NPN and PNP transistors is less than one, and no current flows due to the reverse biasing of the pn junction between the n-type layer and the p-type layer.

When the gate voltage is sufficiently positive relative to the cathode electrode, electrons accumulate under the gates between adjacent n+ regions and deeper than the n+ regions. This inversion of the p-type layer reduces the base width of the NPN transistor and thus increases its beta so that the product of the betas of the NPN and PNP transistors exceeds one. The initially small diffusion current gets amplified by current feedback until the vertical and lateral current through the device causes the emitter/base of the NPN transistor to be forward biased so that both the NPN and PNP transistors are on. The device is now fully conducting.

When the gate is again shorted to the cathode electrode, or otherwise reduced below a turn-off threshold, the NPN transistor base width again becomes wide, and the product of the betas (now below one) can no longer sustain the current conduction. The device thus turns off.

In one embodiment, the p-type layer may have shallower areas below the gates that result in an increased beta of the NPN transistor, for a given gate voltage, when turning on the IGTO device. This increases turn-on speed and improves reliability.

In another embodiment, DMOS transistors are also formed in the IGTO device to lower the beta of the NPN transistor in the off state, so there is a greater differential between the beta in the off state and the beta when the gate voltage is at the threshold voltage. The DMOS transistors add a p+ region surrounding at least some of the n+ regions, and the p+ regions (forming part of the NPN transistor base) lowers the beta in the off state.

The dopant levels, layer depths, carrier flow paths, and carrier lifetimes are controlled to avoid the latch-up of conventional thyristors, thereby allowing the device to be turned on and off via the gate.

By using planar gate technology, the IGTO device may be more easily integrated with other devices on the same wafer.

A high current device may be implemented by forming a cellular structure or forming the n+ regions, the p+ regions, and the gates in strips.

In another embodiment, a bi-directional IGTO device is created by forming a mirror image structure on the top and bottom of the device.

In another embodiment, a hybrid device uses the IGTO structure describe above along with a separate IGBT at the edge of a p-type well, where the p-type well serves as the base for the NPN transistor in the previously IGTO device and also serves as a channel for the IGBT. No additional processing steps are needed. When the IGTO and IGBT gates are sufficiently positively biased, and the anode/cathode is forward biased, the IGBT more quickly causes a vertical current flow to occur to start the conduction of the IGTO device. The gate threshold voltage for the IGBT may also be more accurately controlled than the gate threshold for the IGTO portion.

Other embodiments are described.

BRIEF DESCRIPTION OF THE DRAWINGS

Elements that are similar or identical in the various figures are labeled with the same numeral.

DETAILED DESCRIPTION

Figure 1:
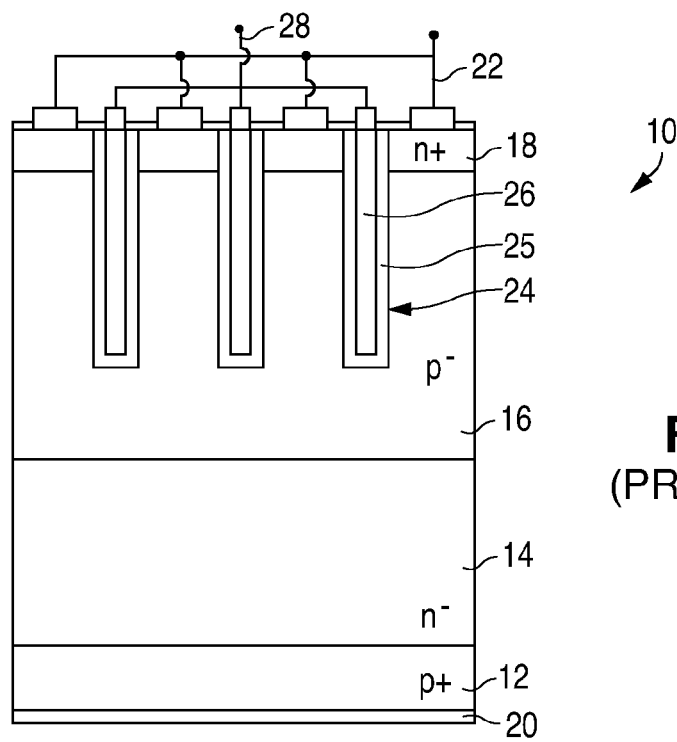
FIG. 1 is a cross-sectional view of a prior art insulated gate turn-off (IGTO) device.
Figure 2:
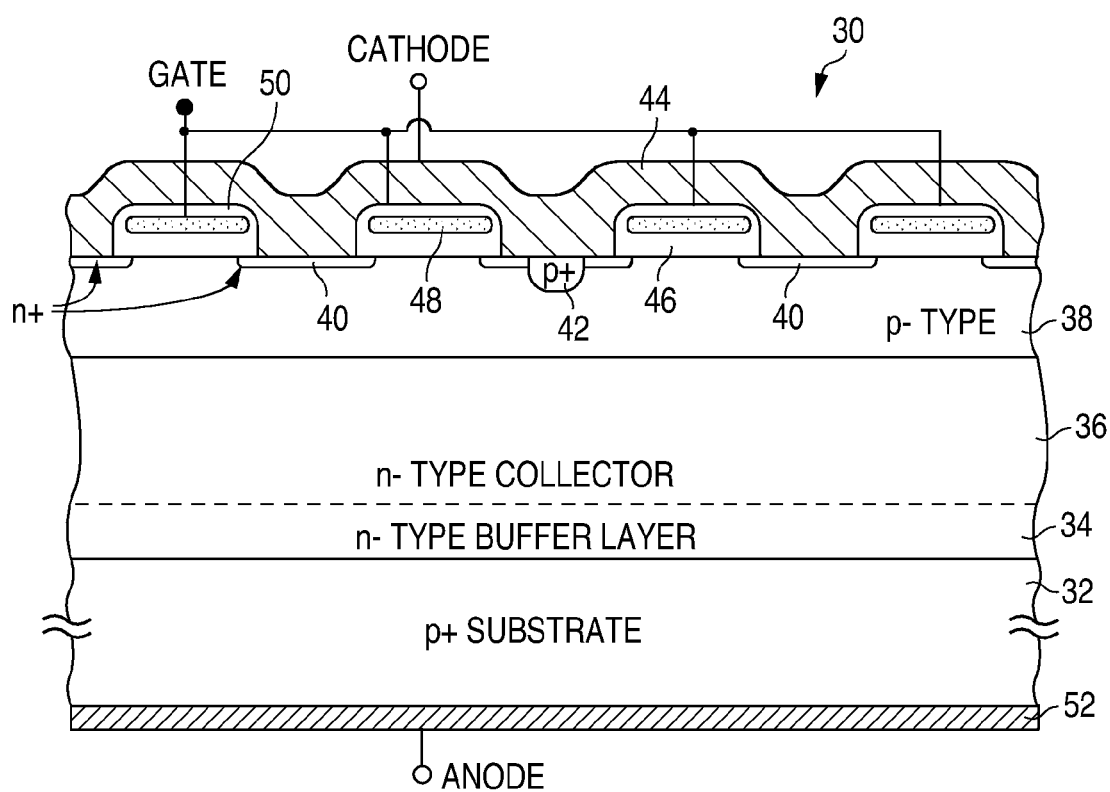
FIG. 2 is a cross-sectional view of the planar gate IGTO device in accordance with one embodiment of the present invention.
Figure 3:
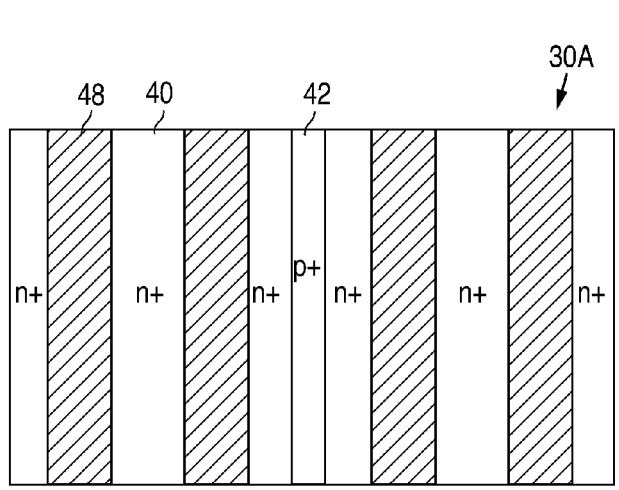
FIG. 3 is a possible top down view of the structure of FIG. 2, where the various surface structures are formed as strips. A similar technique may be used for any of the embodiments to achieve the desired current.
Figure 4:
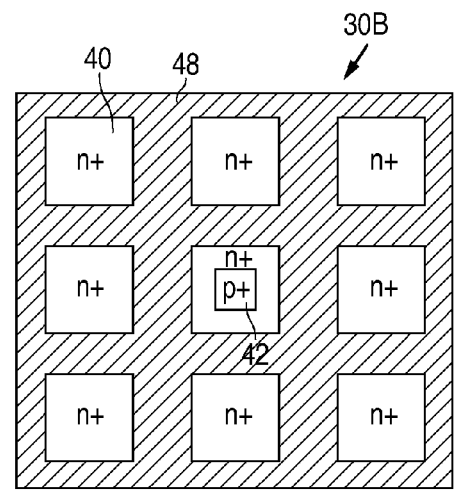
FIG. 4 illustrates how the planar gate IGTO of FIG. 2 may be formed as an array of parallel-connected cells for a high current. A similar technique may be used for any of the embodiments to achieve the desired current.

FIG. 2 is a cross-sectional view of a small portion of a vertical IGTO device 30 formed in a single die. The size of the device 30 depends on the required current to be conducted. FIG. 3 illustrates that the various surface regions may be formed as thin strips, and FIG. 4 illustrates that the various surface regions may be formed as cells, where the pattern of FIG. 4 is repeated over the surface. All embodiments use planar gates rather than trench gates.

Briefly, in FIG. 2, an NPNP layered structure is formed, where the NPN and PNP bipolar transistors are turned on when there is a sufficient forward voltage applied between the anode and cathode electrodes and the gate is sufficiently positively biased. When the gate is biased at greater than the turn-on threshold voltage, the effective base width of the NPN transistor is sufficiently short (or narrow) to raise the beta of the NPN transistor above what is needed to cause the product of the betas of the NPN and PNP transistors to exceed one. Any current is then greatly amplified by feedback, turning on the transistors even more. This is referred to as "breakover," where the injected carrier concentration increases and the conduction between the anode and cathode rapidly increases to its maximum.

Further details of the fabrication of the IGTO device 30 are presented below, followed by a more detailed description of its operation.

The starting p+ substrate 32 may have a dopant concentration of $1\times10^{18}$ to $2\times10^{19}$ cm$^{-3}$.

The optional n-type buffer layer 34 is then epitaxially grown to a thickness of 3-10 microns thick and has a dopant concentration between about $10^{17}$ to $5\times10^{17}$ cm$^{-3}$. The n-type buffer layer 34 reduces the injection of holes into the n-type layer 36 from the p+ substrate 32 when the device is off, since the n-type buffer layer 34 has a dopant concentration higher than that of the n-type layer 36.

The thicker n-type layer 36 is then grown to a thickness of 40-70 microns (for a 600V device) and has a doping concentration between about $5\times10^{13}$ to $5\times10^{14}$ cm$^{-3}$. The thickness depends on the desired maximum voltage of the device. This dopant concentration can be obtained by in-situ doping during epitaxial growth.

The p-type layer 38 may be formed by implanting dopants or by in-situ doping during growth. The peak doping in the p-type layer 38 can be, for example, $10^{16}$-$10^{18}$ cm$^{-3}$. The depth of the p-type layer 38 depends on the maximum voltage of the device and the effect of the gate electric field on the p-type layer 38. The p-type layer 38 will typically be between 0.1-10 microns.

A thin gate oxide layer 46 is thermally grown over the surface to, for example, 0.05-0.15 microns thick. Conductive material (for forming the gates 48), such as heavily doped polysilicon or undoped polysilicon that is subsequently doped, is then deposited over the gate oxide layer 46. The polysilicon is masked and etched to form the gate conductor.

A masked implant is then used to create the n+ regions 40. The n+ regions 40 have a depth of, for example, 0.05-1.0 microns. In one embodiment, the n+ regions 40 are formed by an implant of arsenic or phosphorus at an energy of 10-150 keV and an area dose of $5\times10^{13}$ to $10^{16}$ cm$^{-2}$, to create a dopant concentration exceeding $10^{19}$ cm$^{-3}$.

Another masked implant is then used to create the distributed p+ regions 42. The p+ regions 42 need to completely penetrate the n+ regions 40 so as to create an ohmic path between the p-type layer 38 and the subsequently formed cathode electrode 44. The p+ regions 42 are evenly distributed over the surface of the device to cause a sufficient voltage differential through the p-type layer 38, when a small current flows, for turning on the NPN transistor.

The area of the gate layer over the central portion of each of the n+ regions 40 is exposed with a mask, and the exposed areas are etched to pattern the gates 48.

A dielectric layer 50 is then deposited, masked, and etched to cover the top and sides of the gates 48 while exposing the central portions of the n+ regions 40. The p+ regions 42 are also exposed.

Various metal layers are then deposited to form the gate electrodes (outside the cross-section), the cathode electrode 44, and the anode electrode 52. The p+ substrate 32 may be thinned prior to forming the anode electrode 52.

The IGTO devices in any of the figures may have the anode and cathode reversed by reversing the polarities of the materials.

FIG. 3 is a possible top down view of a portion of the entire IGTO device 30A, without the opaque cathode electrode, which may be repeated laterally and extended in length to conduct the desired maximum current. A high current IGTO device may have sides of 1 cm. The various surface structures are formed in strips. The spacings between the n+ strips (emitters of the NPN transistor) should be a minimum to conduct the highest current with the smallest area.

The cross-section of FIG. 2 may also be a cross-section of the cellular structure shown in FIG. 4 (IGTO device 30B), without the opaque cathode electrode, where the cell is repeated to achieve the desired maximum current. The p+ regions 42 are distributed throughout the array of cells, as needed. In FIG. 4, the gates 48 (in FIG. 2) are part of a continuous gate surrounding the cells.

The particular dopant concentrations and thicknesses of the n and p-type layers 36 and 38 are selected based on the desired breakdown voltage and gate threshold voltage.

The p-type layer 38 acts as a base for the NPN bipolar transistor formed by the n+ regions 40 (emitters), p-type layer 38 (base), and n-type layer 36 (collector). When the gates 48 are externally shorted to the n+ regions 40 and p-type layer 38 (via the p+ regions 42), or otherwise biased below the device threshold voltage, the effective base width is wide (or long), resulting in a low beta for the NPN transistor. The p-type layer 38, the n-type layer 36, and the p+ substrate 32 form a PNP bipolar transistor. With a forward bias voltage applied to the anode and cathode electrodes 52/44, the product of the betas of the NPN and PNP transistors is less than one, and no current flows due to the reverse biasing of the pn junction between the n-type layer 36 and the p-type layer 38. The required dopant levels and layer thicknesses to create the desired betas may be determined by simulation.

When the gate voltage is sufficiently positive relative to the cathode voltage (e.g., 2-5 volts), electrons accumulate under the gates 48 between adjacent n+ regions 40 and deeper than the n+ regions 40. This reduces the base width of the NPN transistor and thus increases its beta so that the product of the betas of the NPN and PNP transistors exceeds one. The initially small diffusion current gets amplified by feedback until the vertical and lateral current through the p-type layer 38 causes a voltage differential exceeding 0.6 volts across the NPN transistor's emitter-base junction to turn on the NPN transistor. Holes from the p+ substrate 32 and electrons from the n+ regions 40 are increasingly injected into the p-type and n-type layers 38/36 until both the NPN and PNP transistors are fully conducting to conduct current between the anode electrode 52 and the cathode electrode 44 with a voltage drop around 1.4 volts.

When the gate 48 is again shorted to the cathode electrode 44, or otherwise reduced below the device threshold voltage, the NPN transistor base width again becomes wide, and the product of the betas (now below one) can no longer sustain the current conduction. The device thus turns off. The threshold beta of the NPN transistor needed to turn on the IGTO device may be higher than the threshold beta of the NPN transistor needed to turn off the IGTO device, although they may be the same in certain embodiments.

The dopant levels and layer depths are controlled to avoid latch-up at the operating current to allow the device to be turned on and off via the gate. This is different from a conventional thyristor operation where latch-up is used during normal operation and gate turn-off is not possible.

By using planar gate technology, the IGTO device is less expensive to manufacture since no gate trenches are formed, the device has a more precise turn-on voltage than trench-gated devices, and the device may be more easily integrated with other devices on the same wafer. The p-type layer 38 may be formed as a p-well to electrically insulate the IGTO device from other circuits formed in the same n-type layer 36. Highly doped sinkers may further insulate the p-well from the other devices and prevent any parasitic bipolar transistors from turning on.

Figure 5:
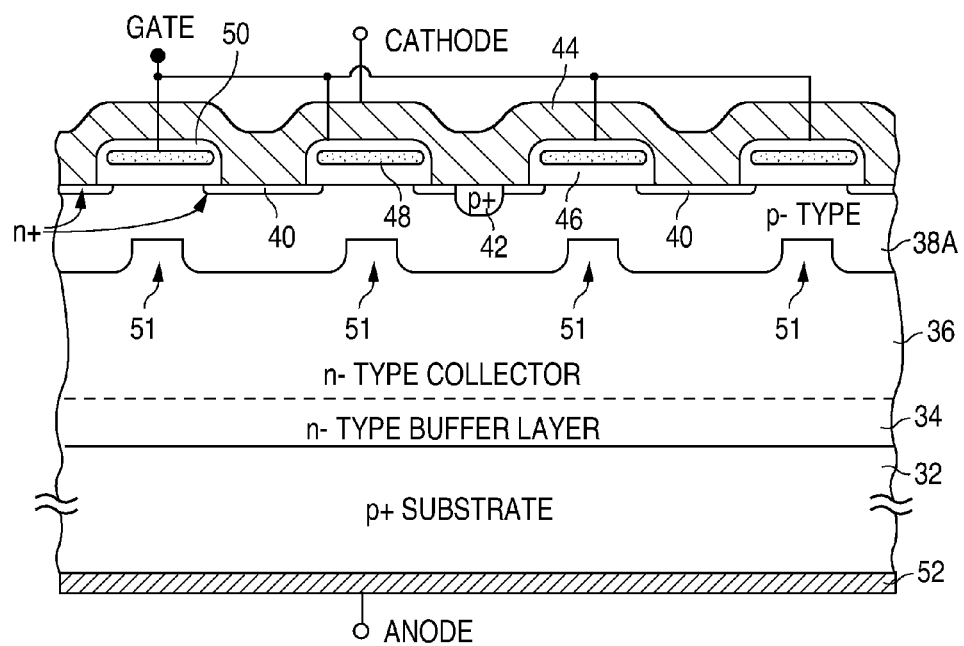
FIG. 5 is a variation of FIG. 2 where the p-type layer is shallower below the gates.

FIG. 5 is similar to FIG. 2 except that the p-layer 38A under the gates 48 is made shallower to affect the base widths of the NPN transistor. The length of the shallow region 51 under the gates 48 is shown less than the gate length, and may be much less, relative to the gate 48, than shown in FIG. 5 to avoid an edge of the shallow region 51 being too close to the n+ regions 40. When the gate voltage is below the turn-on threshold, the NPN transistor base width is high due to the distance between the n+ regions 40 and the n-type layer 36. Therefore, the beta of the NPN transistor is relatively low. When the gate voltage is biased above the threshold voltage, more of the p-type layer 38A under the gate 48 is inverted, compared to FIG. 2, due to the initial shallowness of the region 51 under the gate 48, so the resulting base width is narrower compared to that of FIG. 2. Thus, the resulting beta of the NPN transistor is increased, compared to that of FIG. 2. Therefore, the IGTO device of FIG. 5 can turn on at a lower gate voltage compared to FIG. 2, or the device can turn on faster with the same gate voltage.

The p-type shallow regions 51 under the gates 48 may be formed using separate masking and doping steps which are fully compatible with the remainder of the process. The n+ regions 40 may be self-aligned to the edges of the gates 48 by introducing the n-dopant after the gate polysilicon is deposited and etched.

Figure 6:
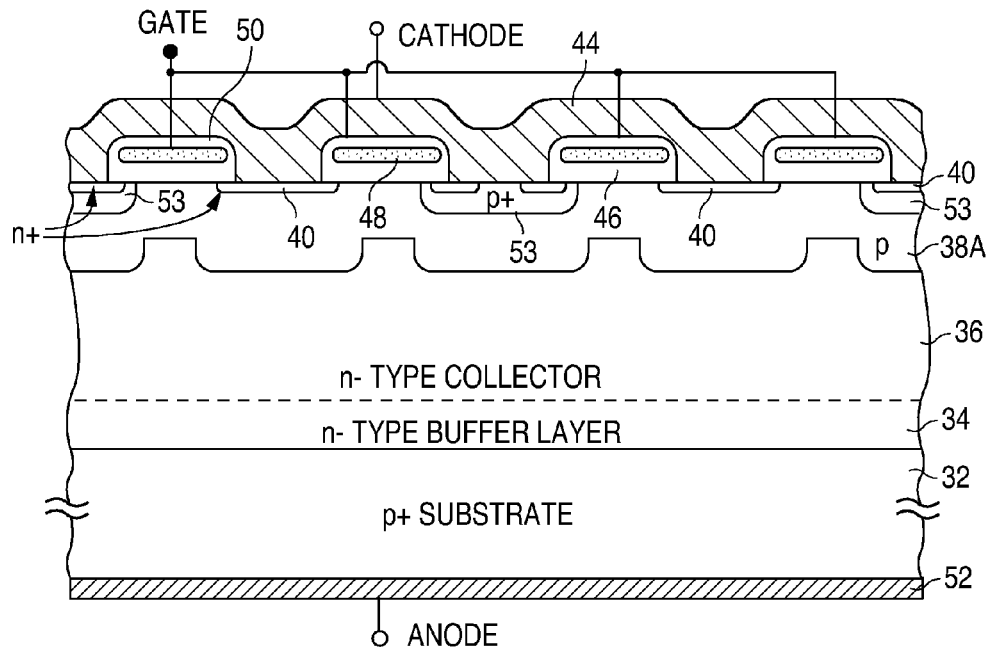
FIG. 6 is a variation of FIG. 5 where shallow p+ type regions surround some of the n+ regions and extend under some of the gate edges to form lateral DMOS transistor structures. The resulting device is a hybrid IGTO/DMOS device.

FIG. 6 is a variation of FIG. 5 with a p+ region 53 at least partially surrounding some, but not all, of the n+ regions 40. In the example, the p+ regions 53 are symmetrically formed around the edge and middle n+ regions 40. More generally, the p+ regions 53 may be formed under alternating gate edges. Such p+ regions 53 (forming part of the NPN transistor base)

reduce the beta of NPN transistor in the off state. The area between the edge of the p+ region 53 and the n+ region 40 forms an n-channel of a DMOS transistor. When the gates 48 are sufficiently positively biased, the channel inverts (effectively coupling the n+ regions 40 to the p-type layer 38A) while the p-type base under the gates 48 is controlled by the gate to have a reduced width. Therefore, the differential beta of the NPN transistor between the off-state and the on-state greatly increases using the design of FIG. 6. A larger differential in betas improves reliability, makes process variations less significant, reduces the possibility of latch-up, improves the turn-off speed, and makes the device operation less affected by noise. The threshold voltage of the DMOS transistors is determined by the n+ and p+ doping profiles. Both the n+ regions 40 and the p+ regions 53 are self-aligned to the polysilicon gates 48.

Figure 7:
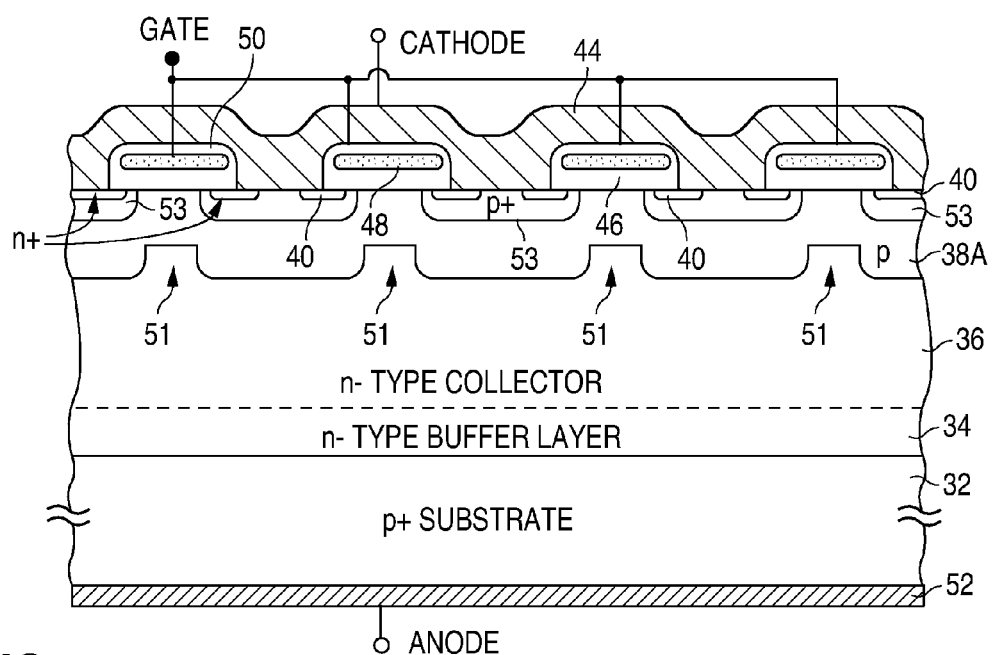
FIG. 7 is a variation of FIG. 6 where the shallow p+ type regions extend under all of the gate edges to form lateral DMOS transistor structures. The resulting device is a hybrid IGTO/DMOS device.

FIG. 7 is similar to FIG. 6 but all the n+ regions 40 are surrounded by the p+ region 53. The effect on the differential betas is thus greater than the effect using the design of FIG. 6.

Figure 8:
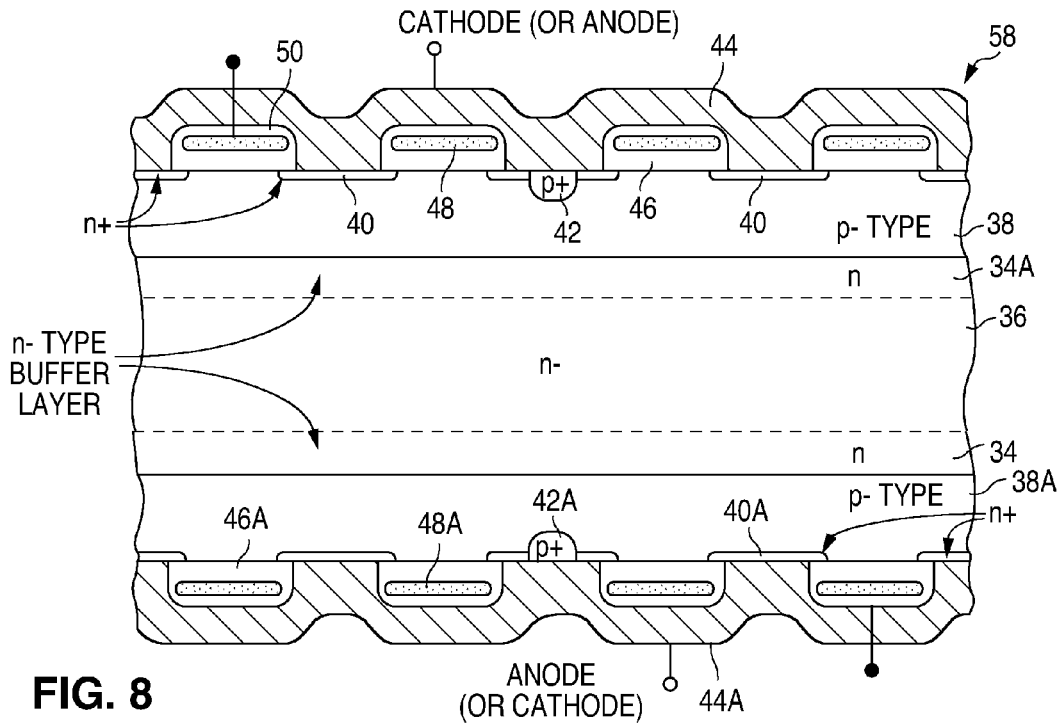
FIG. 8 illustrates a bi-directional version of the structure of FIG. 2. Similar modifications can be made to the remaining structures to form bi-directional devices.

In another embodiment, shown in FIG. 8, a bi-directional IGTO device 58 is created by forming a mirror image structure on the top and bottom of the device. The elements that are in common with FIG. 2 are similarly numbered. The exact same structure is formed on the opposite side of the wafer. In one embodiment, the starting substrate is p-type for creating the p-type layer 38A. In another embodiment, the substrate may be thinned to achieve the desired thickness of the p-type layer 38A. Alternatively, the substrate may be doped by implantation to create the p-type layer 38A. The remainder of the additional layers and surface features may be formed using the same steps as used to form the corresponding elements shown in FIG. 2. Specifically, a reverse side process is used to form the n+ regions 40A, the p+ regions 42A, the gates 48A, and the remaining elements shown in FIG. 2. The electrodes 44 and 44A can be either anode/cathode or cathode/anode so the device 58 may be used for AC switching applications. Any of the design modifications of the remaining embodiments may be incorporated in FIG. 8.

Figure 9:
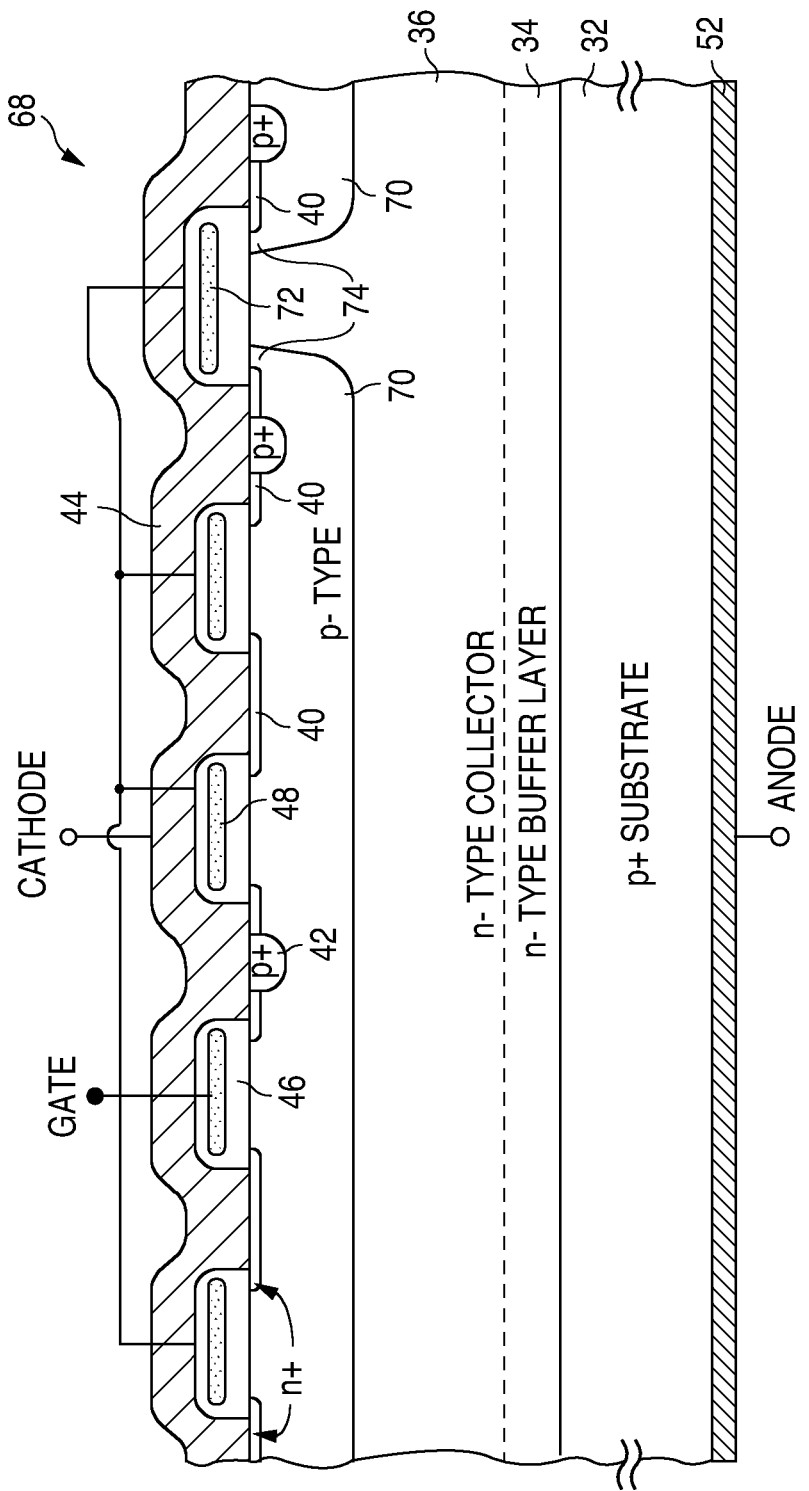
FIG. 9 illustrates how the p-type layer in FIG. 2 may be a p-well, and the edge of the p-well serves as a channel for an IGBT to enhance turn-on of the IGTO device. The hybrid device may be formed for high currents using the strip or cellular topologies. Similar modifications can be made to the remaining structures to form hybrid devices.

FIG. 9 illustrates a hybrid device 68 that uses the IGTO structure of FIG. 2 along with a separate IGBT at the edge of a p-type well 70, where the p-type well 70 serves as the base for the NPN transistor in the previously described IGTO device and also serves as a channel for the IGBT. No additional processing steps are needed. In this example, the p-type layer 38 in FIG. 2 is actually a portion of the p-well 70.

The device may be symmetric around the IGBT gate in each cell. The p-wells 70 are formed by masking and boron dopant implantation. The peak doping in the p-wells 70 can be, for example, $10^{16}$-$10^{18}$ cm$^{-3}$. The depth of the p-well 70 depends on the maximum voltage of the device and may be between 0.1-10 microns. The masking may be done using a field oxide (not shown) that is left on the device. LOCOS technology may be used.

The IGBT gate 72 (which may be the same gate layer used to form the IGTO gates 48) is formed over a channel area 74 of the p-wells 70. The IGBT gate 72 may be shorted to the IGTO gates 48. Assuming the anode/cathode is forward biased, a sufficiently positive voltage on the gate 72 (e.g., 2-5 volts) inverts the channel area 74, and current flows laterally between the adjacent n+ regions 40 and the n-type layer 36. The current then flows vertically to the anode electrode 52. The current is sufficiently large to accelerate turn-on of the IGTO device portion, which results in a much larger current flowing. More specifically, the turning on of the IGBT increases the injection of carriers into the n-type layer 36, enabling the IGTO portion to turn on faster. Since the gate threshold voltage for the IGBT is typically more accurately controlled than the gate threshold for the IGTO portion, the turn-on voltage for the hybrid device 68 is more precise and repeatable than the turn-on voltage for the IGTO device of FIG. 2.

When the gates 48/72 are shorted to the cathode electrode 44, the hybrid device 68 turns off.

In another embodiment, the gate 72 is controlled separately from the gates 48 for a more controlled turn-on, such as for controlling in-rush currents.

The hybrid device 68 may be formed in strips, similar to FIG. 3, or as a cellular structure, similar to FIG. 4. The IGBT may be symmetrically distributed over the device 68 as needed. Since an IGTO device is more efficient than an IGBT, the number of IGBTs should be kept to a minimum. The required topology may be determined using simulation.

Any of the design modifications of the remaining embodiments may be incorporated in FIG. 9

Figure 10:
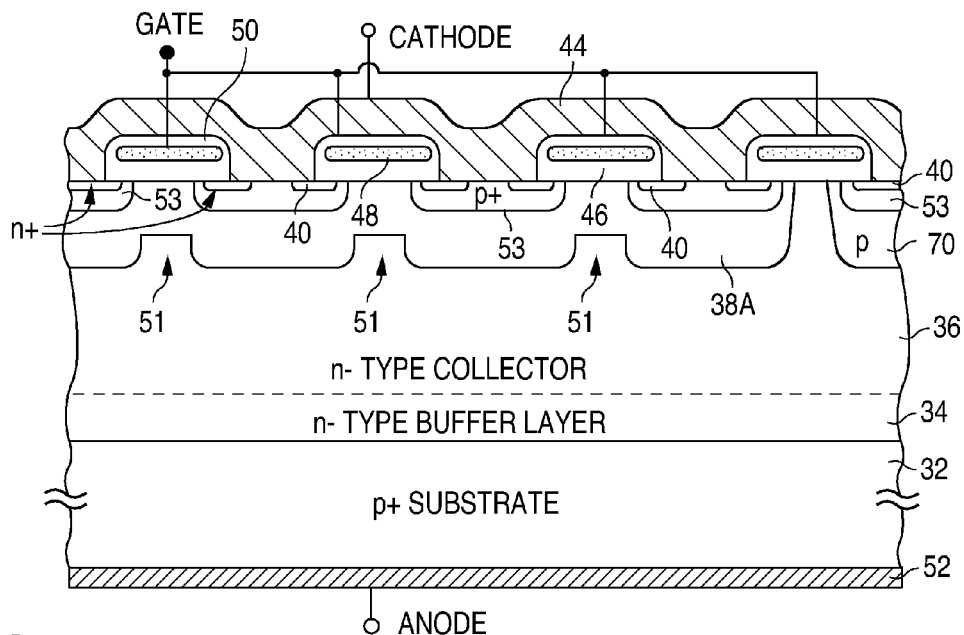
FIG. 10 is a variation of FIG. 9 where shallow p+ type regions extend under all of the gate edges to form lateral DMOS transistor structures.

FIG. 10 is a variation of FIG. 9, which incorporates the p-type shallow regions 51 under the gates 48 (for increasing the NPN transistor beta at turn-on) and incorporates the p+ regions 53 surrounding the n+ regions 40 for lowering the off-state beta of the NPN transistor. The p+ regions 53 and the edge of the n+ regions 40 are self-aligned to the gates 48

The various layers may be opposite conductivity types for conduction in the reverse direction.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:
   a first semiconductor layer of a first conductivity type;
   a first electrode electrically contacting the first semiconductor layer;
   a second semiconductor layer of a second conductivity type over the first semiconductor layer;
   a third semiconductor layer of the first conductivity type over the second semiconductor layer;
   first regions of the second conductivity type formed in a top surface of the third semiconductor layer, adjacent first regions having a gap between them,
   wherein a vertical structure of NPN and PNP transistors is formed, and wherein the third semiconductor layer forms a first base of one of the transistors;
   a second electrode electrically contacting the first regions and the third semiconductor layer; and
   first planar gates above the gaps between the first regions and insulated from the third semiconductor layer, wherein the second electrode electrically contacts the adjacent first regions on opposite sides of the first planar gates,
   the third semiconductor layer having a thickness and a dopant concentration such that, when a forward biasing voltage is applied between the first electrode and the second electrode and when a turn-on voltage is applied to the gates, the gates create an inversion layer in the underlying third semiconductor layer to cause the first base to have a reduced width, causing the beta of the one of the transistors to increase beyond a first threshold to turn on the IGTO device to conduct a current between the first electrode and the second electrode,
   wherein, when a turn-off voltage is applied to the gates, the first base has an increased width, causing the beta of the one of the transistors to be reduced below a second threshold to turn off the IGTO device.

2. The device of claim 1 wherein the third semiconductor layer is a well.

3. The device of claim 1 wherein the first regions and gates are formed as strips.

4. The device of claim 1 wherein the first regions are formed as cells, wherein the gates comprise a continuous gate surrounding each of the cells.

5. The device of claim 1 further comprising second regions of the first conductivity type formed in the third semiconductor layer, wherein the second electrode electrically shorts the second regions to the first regions.

6. The device of claim 1 wherein the first conductivity type is a p-type and the second conductivity type is an n-type.

7. The device of claim 1 further comprising:
second regions of the second conductivity type formed in a surface of the first semiconductor layer, adjacent second regions having a gap between them;
second planar gates above the gaps between the second regions and insulated from the first semiconductor layer, wherein the device is a bi-directional conduction device, depending on polarities of voltages applied to the first electrode and the second electrode and biasing voltages applied to the first planar gates and the second planar gates.

8. The device of claim 1 wherein the third semiconductor layer is a well, wherein a gap between one of the first regions and an end of the well forms a channel, the device further comprising:
a second planar gate formed over and insulated from the channel to form an insulated gate bipolar transistor (IGBT), such that biasing the second planar gate above a turn-on voltage of the IGBT inverts the channel between the one of the first regions and the second semiconductor layer to turn on the IGBT to conduct a current between the first electrode and the second electrode.

9. The device of claim 1 wherein, to turn on the device, a biasing voltage applied to the first planar gates causes the product of the betas of the NPN and PNP transistors to exceed one.

10. The device of claim 1 wherein the first semiconductor layer is a substrate.

11. The device of claim 1 wherein the third semiconductor layer has shallower regions below at least some of the gates and deeper regions away from the gates.

12. The device of claim 1 further comprising at least one second region of the first conductivity type at least partially surrounding at least one of the first regions of the second conductivity type, wherein a gap between an edge of the second region and an edge of the first region lies under one of the first planar gates to form a channel of a DMOS transistor, wherein the channel is inverted when the turn-on voltage is applied to the gate.

13. A method of controlling an insulated gate turn-off (IGTO) device formed as a die, the IGTO device comprising a first semiconductor layer of a first conductivity type, a first electrode electrically contacting the first semiconductor layer, a second semiconductor layer of a second conductivity type over the first semiconductor layer, a third semiconductor layer of the first conductivity type over the second semiconductor layer, first regions of the second conductivity type formed in a top surface of the third semiconductor layer, adjacent first regions having a gap between them, wherein a vertical structure of NPN and PNP transistors is formed, and wherein the third semiconductor layer forms a first base of one of the transistors, a second electrode electrically contacting the first regions and the third semiconductor layer, and first planar gates above the gaps between the first regions and insulated from the third semiconductor layer, wherein the second electrode electrically contacts the adjacent first regions on opposite sides of the first planar gates, the method comprising:
applying a forward biasing voltage between the first electrode and the second electrode;
applying a turn-on voltage to the gates, resulting in the gates creating an inversion layer in the underlying third semiconductor layer to cause the first base to have a reduced width resulting in the beta of the one of the transistors to increase beyond a first threshold to turn on the IGTO device to conduct a current between the first electrode and the second electrode; and
applying a turn-off voltage to the gates, resulting in the first base having an increased width to cause the beta of the one of the transistors to be reduced below a second threshold to turn off the IGTO device.

14. The method of claim 13 wherein applying the turn-on voltage to the gates increases a beta of one of the NPN and PNP transistors.

15. The method of claim 13 wherein the third semiconductor layer is a well.

16. The method of claim 13 wherein the first regions and gates are formed as strips.

17. The method of claim 13 wherein the first regions are formed as cells, wherein the gates comprise a continuous gate surrounding each of the cells.

18. The method of claim 13 wherein the third semiconductor layer is a well, wherein a gap between one of the first regions and an end of the well forms a channel, the device further comprising a second planar gate formed over and insulated from the channel to form an insulated gate bipolar transistor (IGBT), the method further comprising:
biasing the second planar gate above a turn-on voltage of the IGBT to invert the channel between the one of the first regions and the second semiconductor layer to turn on the IGBT to conduct a current between the first electrode and the second electrode.

19. The method of claim 13 wherein the first threshold beta is different from the second threshold beta.

20. The method of claim 13 wherein the first conductivity type is a p-type and the second conductivity type is an n-type.

* * * * *